United States Patent [19]

Andrevski

[11] Patent Number: 4,623,608
[45] Date of Patent: Nov. 18, 1986

[54] METHOD AND APPARATUS FOR COATING A SELECTED AREA OF THE SURFACE OF AN OBJECT

[75] Inventor: Zygmunt M. Andrevski, Princeton Township, Mercer County, N.J.

[73] Assignee: RCA Corporation, Princeton, N.J.

[21] Appl. No.: 711,719

[22] Filed: Mar. 14, 1985

[51] Int. Cl.$^4$ ............................................. G03B 27/42
[52] U.S. Cl. ...................................... 430/322; 430/22; 430/324; 430/329; 430/331; 355/43
[58] Field of Search ................ 355/43, 45; 430/5, 22, 430/315, 322, 324, 329, 331

[56] References Cited

U.S. PATENT DOCUMENTS

| | | | |
|---|---|---|---|
| 4,107,351 | 8/1978 | James et al. | 430/324 |
| 4,266,334 | 5/1981 | Edwards et al. | 29/583 |
| 4,383,018 | 5/1983 | Martin et al. | 430/7 |
| 4,397,928 | 8/1983 | Sato et al. | 430/7 |
| 4,444,492 | 4/1984 | Lee | 355/43 |
| 4,473,293 | 9/1984 | Phillips | 355/45 |
| 4,539,222 | 9/1985 | Anderson, Jr. et al. | 430/329 |

FOREIGN PATENT DOCUMENTS

| | | | |
|---|---|---|---|
| 0017759 | 10/1980 | European Pat. Off. | 355/45 |
| 0031193 | 2/1982 | Japan | 430/315 |

OTHER PUBLICATIONS

Introduction to Microlithography, Thompson, Wilson and Bowden, ACS Symposium Series, Washington, DC 1983, pp. 9 and 16-19.

*Primary Examiner*—John E. Kittle
*Assistant Examiner*—Patrick J. Ryan
*Attorney, Agent, or Firm*—Birgit E. Morris; Donald S. Cohen

[57] ABSTRACT

Selected areas of the surface of a substrate, such as the surface of a substrate of single crystalline silicon having at least one CCD image sensor along an opposed surface of the substrate, is coated with a metal by coating the surface to be coated with a layer of a photoresist. The substrate is then supported, such as by a vacuum chuck, with the photoresist layer being exposed. A mask, which is supported above the substrate, is moved close to but spaced from the photoresist layer. The substrate is then moved, such as by means of an x-y-$\theta$ aligner table on which the chuck is mounted, until a pattern on the mask is aligned with areas of the substrate surface. A light directed through the substrate and the mask from below the substrate and viewed by a microscope above the mask assists in achieving the alignment. The mask is then lowered onto the photoresist layer and lies thereon under only its own weight. Radiation is then directed onto the photoresist layer through the mask. The mask is then lifted from the photoresist and the substrate is removed from the chuck. After developing the photoresist layer to expose areas of the substrate surface, a metal film is coated on the exposed areas of the substrate surface. The remaining photoresist is then removed.

9 Claims, 2 Drawing Figures

METHOD AND APPARATUS FOR COATING A SELECTED AREA OF THE SURFACE OF AN OBJECT

The present invention relates to a method and apparatus for alignment of a coating on a selected area of a surface of an object, and more particularly, to a method and apparatus for alignment of a mask over a selected area of a surface of a charge-coupled device (CCD) image sensor with a metal film.

BACKGROUND OF THE INVENTION

A frame transfer CCD image sensor in general includes three sections: a photosensing array, known as the A-register; a temporary storage array, known as the B-register; and an output register, known as the C-register. The three registers are formed along a major surface of a substrate of semiconductor material. It is the practice to mask out the B-register and the C-register so that light from the image being sensed will only impinge the A-register. In one type of CCD image sensor the light enters the semiconductor substrate through its surface opposite to the surface along which the registers are formed, which surface is generally referred to as the back surface of the substrate. In order to allow the light to pass readily through the substrate to the A-register, the substrate is thinned from its back surface and a glass plate is mounted on the back surface to provide support for the thinned substrate. This type of device is described in U.S. Pat. No. 4,266,334 to T. W. Edwards et al., issued May 12, 1981, entitled "Manufacture of Thinned Substrate Imagers".

In this type of imager the mask used for the B-register and C-register has been a metal film coated on the surface of the glass plate. The metal film has been applied to the glass plate using a metal masking plate which is placed over the glass plate, the openings in the masking plate are aligned with the areas of the CCD imager to be covered. The metal is then applied to the glass plate through the openings in the mask plate. This technique of applying the masking film has a number of problems. One problem is achieving good alignment between the masking plate and the CCD image sensor so that the metal film will properly cover the desired areas of the CCD image sensor. Another problem is that the metal masking film is spaced from the CCD image sensor substrate by the glass plate which allows some light to seep under the edge of the masking film through the glass plate. The second problem could be solved by placing the metal masking film directly on the back surface of the CCD image sensor substrate. However, because the CCD image sensor substrate is so thin, about 10 micrometers in thickness, it is very difficult to handle the substrate to apply the metal film directly thereto without breaking the substrate.

SUMMARY OF THE INVENTION

A method of coating a selected area of a surface of a thin substrate with a metal film includes the steps of supporting the substrate with the surface to be coated exposed. The surface is then coated with a layer of photoresist material and a mask is placed over the surface close to but slightly spaced from the photoresist layer. Relative movement is provided between the substrate and the mask to align the pattern of the mask with areas of the surface of the substrate. The mask is then brought into direct contact with the photoresist layer and the photoresist layer is irradiated through the mask. After developing the photoresist layer to expose the selected area of the substrate surface, a metal film is coated on the exposed substrate surface.

DETAILED DESCRIPTION OF PREFERRED EMBODIMENT

Figure 1:
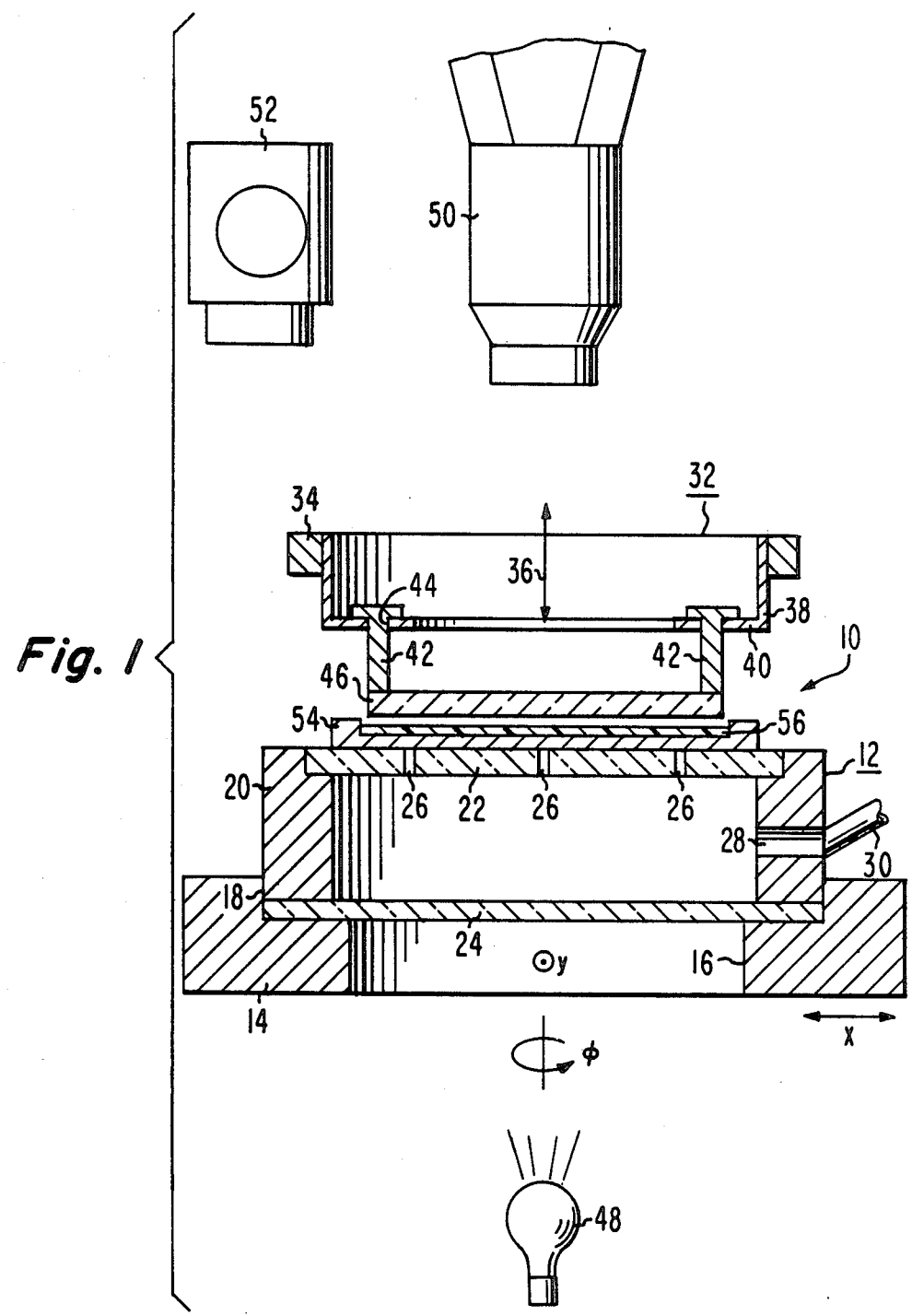
FIG. 1 is a sectioned schematic view of the apparatus of the present invention illustrating one step of the method of the present invention.

Referring initially to FIG. 1, an embodiment of the apparatus of the present invention is generally designated as 10. Apparatus 10 includes a vacuum chuck 12 mounted on an x-y-$\theta$ aligner table 14. The aligner table 14 has an opening 16 therethrough and a recess 18 in its upper surface into which the vacuum chuck 12 is seated. The vacuum chuck 12 includes a cylindrical outer wall 20 the top and bottom plates 22 and 24 respectively extending across and secured to the ends of the outer wall 20. The top and bottom plates 22 and 24 are of a transparent material, such as glass, and the top plate 22 has a plurality of small openings 26 therethrough. The outer wall 20 has an opening 28 therethrough which is connected by a pipe 30 to a source of vacuum, not shown.

A mask holder 32 is mounted over the vacuum chuck 12. The mask holder 32 includes an annular ring 34 which is mounted for vertical movement toward and away from the vacuum chuck 12 as indicated by the double-headed arrow 36. A pair of arms 38 are secured to the inner surface of the annular ring 34 and extend downwardly therefrom. The arms 38 are diametrically opposite each other. Each of the arms 38 has a radially inwardly extending flange 40 at its bottom end. A headed pin 42 slidably extends through an opening 44 in each of the flanges 40. A mask 46 is secured to the ends of the headed pins 42. The mask 46 is a standard photolithographic mask which generally includes a glass plate having a patterned metal film on one surface thereof.

Figure 2:
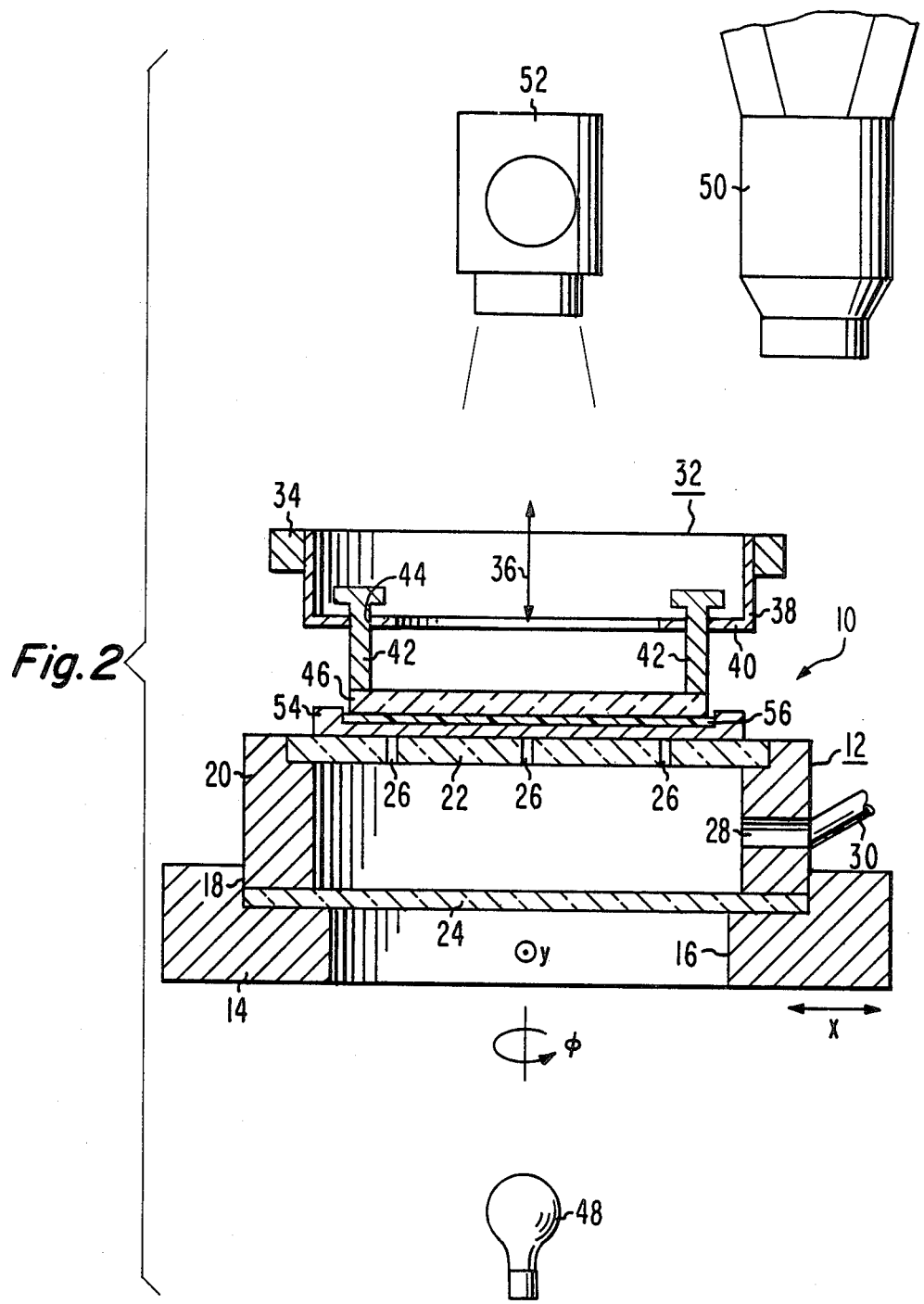
FIG. 2 is a view similar to FIG. 1 showing another step of the method of the present invention.

Below the aligner table 14 is a light source 48 which is adapted to shine a beam of light through the opening 16 in the aligner table 14, the bottom plate 24 and top plate 22 of the vacuum chuck 12, the mask 46 and the center of the mask holder ring 34. Above the mask holder 32 is a microscope 50 for viewing the mask 46. The microscope 50 is mounted for movement between a position directly over the mask 46 as shown in FIG. 1 to a position beside the apparatus 10 as shown in FIG. 2. Also above the mask holder 32 is a source 52 of light, such as UV light, for exposing photoresist. The light source 52 is mounted for movement between a position beside the apparatus 10 as shown in FIG. 1 to a position directly over the mask 46 as shown in FIG. 2.

To coat selected areas of the surface of a substrate, such as the B- and C-registers of a CCD image sensor formed along the surface of a substrate 54 of single crystalline silicon which is opposed to the surface to be coated, with a metal film in accordance with the method of the present invention and using the apparatus 10, a layer 56 of photoresist is coated over the surface of the substrate 54. The substrate 54 is then seated on the top plate 22 of the vacuum chuck 12 with the photoresist layer 56 facing upwardly. A vacuum is drawn through the opening 28 and the openings 26 in the top plate 22 to hold the substrate 54 firmly to the top plate 22. The mask holder 32 is then lowered until the mask 46 is close to but slightly spaced from the photoresist layer 56 as shown in FIG. 1. The light source 48 is turned on to direct light through the substrate 54, the photoresist layer 56, and the mask 46. With the microscope 50 being over the mask 46, and looking through the microscope 50, the CCD imager sensor pattern on the substrate 54 and the pattern on the mask 46 can be seen. The aligner table 14 is then moved in the appropriate x, y and/or $\theta$ direction to move the substrate 54 with respect to the mask 46 until the B- and C-registers are directly aligned with the pattern on the mask 46.

The mask holder 32 is then lowered until the mask 46 contacts the photoresist layer 56 as shown in FIG. 2. Once the mask 46 contacts the photoresist layer 56, the mask holder 32 is lowered slightly more until the flanges 40 are free of the heads of the pins 42. The mask 46 is then resting under its own weight on the photoresist layer 56 with the pattern of the mask 46 being aligned with the B- and C-registers of the CCD image sensors on the substrate 54. As shown in FIG. 2, the microscope 50 is then moved aside and the UV light source 52 is moved directly over the mask 46. The light source 48 can then be turned off and the UV light source 52 turned on to expose the portions of the photoresist layer 56 not covered by the pattern on the mask 46.

The mask holder 32 is then moved upwardly to lift the mask 46 from the photoresist layer 56. The vacuum to the vacuum chuck 12 is turned off and the substrate 54 is removed from the vacuum chuck. The photoresist layer 56 is then developed to remove the unexposed portions of the photoresist layer 56 to expose the areas of the surface of the substrate 54 which are to be coated with the metal film. The substrate 54 is then placed in a suitable coating apparatus, such as an apparatus for coating by evaporation or by sputtering, and a metal film is coated over the photoresist layer 56 and the exposed areas of the surface of the substrate 54. After removing the coated substrate 54 from the coating apparatus, it is subjected to a solvent which will remove the remainder of the photoresist layer 56, which also removes the portions of the metal film coated on a photoresist layer, leaving the metal film only on the selected areas of the surface of the substrate 54.

Thus, there is provided by the present invention a method and apparatus for coating selected areas of the surface of a thin substrate with a metal film which is accurately aligned with portions of the substrate and is directly on the surface of the substrate. The method uses photolithographic techniques which provides for the accurate alignment of the metal coating on the selected areas. The apparatus of the present invention uses a vacuum chuck to securely hold the thin substrate during the photolithographic steps without damaging the substrate. By bringing the mask close to the photoresist layer but slightly spaced therefrom, the substrate can be moved with respect to the mask to achieve good alignment therebetween without damaging the photoresist layer or the substrate. When the mask is lowered onto the photoresist layer there is no pressure applied to the substrate except the weight of the mask so that the substrate is not damaged yet the mask is held in place on the photoresist layer. All of the these factors result in the accurate coating of the selected areas of the thin substrate without breaking the substrate.

Although the method of the present invention has been described with the photoresist material being a positive photoresist, the method can also be used with a negative photoresist material. When using a negative photoresist, the mask is modified so that the radiation will contact the areas of the photoresist layer which are to be removed to expose the areas of the substrate surface which are to be coated with the metal film.

I claim:

1. A method of coating a selected area of a surface of a thin substrate with a metal film including the steps of
   (a) supporting the substrate with the surface to be coated exposed,
   (b) coating said substrate surface with a layer of a photoresist,
   (c) placing a mask over said substrate surface and slightly spaced from the photoresist layer,
   (d) moving the substrate with respect to the mask to align a pattern on the mask with areas of the substrate surface,
   (e) bringing the mask into direct contact with the photoresist layer in a manner so that only the weight of the mask rests on the photoresist layer,
   (f) irradiating the photoresist layer through the mask,
   (g) developing the photoresist layer to expose the selected area of the substrate surface, and
   (h) coating the exposed area of the substrate surface with the metal film.

2. A method in accordance with claim 1 wherein during step (d) a light is directed first through the substrate and then the mask and is viewed from the mask side to permit alignment of the mask and the substrate.

3. A method in accordance with claim 1 in which the metal film is coated over the exposed areas of substrate surface and the remaining photoresist layer, and removing the remaining photoresist layer.

4. A method in accordance with claim 3 in which the substrate is a thin substrate of single crystalline silicon having opposed major surfaces with at least one charge-coupled device image sensor being along one of the major surfaces and the metal layer is coated on the other major surface.

5. An apparatus for use in coating a selected area of a surface of a thin substrate with a metal film comprising
   means for supporting the substrate with the surface to be coated exposed,
   means for moving said supporting means in x-y-$\theta$ directions,
   means for supporting a mask above said substrate surface, said mask supporting means being movable toward and away from said substrate so as to bring the mask into contact with a photoresist layer on the surface of the substrate,
   means for directing a light through the substrate and the mask,
   means for viewing the light after it passes through the mask, and
   means for directing photoresist exposing radiation onto the mask.

6. Apparatus in accordance with claim 5 in which the substrate supporting means is a vacuum chuck having transparent top and bottom plates.

7. Apparatus in accordance with claim 6 in which the means for moving the vacuum chuck is an-x-y-$\theta$ aligner table on which the chuck is supported and having an opening therethrough to the transparent bottom plate of the chuck.

8. Apparatus in accordance with claim 7 in which the light directing means is a light source mounted below the aligner table and adapted to direct its light through the opening in the aligner table and the transparent top and bottom plates of the vacuum chuck.

9. Apparatus in accordance with claim 5 in which the mask supporting means includes an annular ring above and mounted for movement toward and away from the substrate support means, a pair of arms extending downwardly from the ring, a flange extending radially from the end of each arm having an opening therethrough and a headed mask supporting pin slidably mounted in each opening.

* * * * *